United States Patent
Huang

[11] Patent Number: 5,863,820
[45] Date of Patent: Jan. 26, 1999

[54] INTEGRATION OF SAC AND SALICIDE PROCESSES ON A CHIP HAVING EMBEDDED MEMORY

[75] Inventor: Jenn Ming Huang, Taiwan, Taiwan

[73] Assignee: Taiwan Semiconductor Manufacturing Company, Ltd., Hsin-Chu, Taiwan

[21] Appl. No.: 17,480

[22] Filed: Feb. 2, 1998

[51] Int. Cl.⁶ .................. H01L 21/8242; H01L 21/3205; H01L 21/4763
[52] U.S. Cl. ........................... 438/241; 438/258; 438/592
[58] Field of Search ................................. 438/592, 241, 438/258

[56] References Cited

U.S. PATENT DOCUMENTS

| | | |
|---|---|---|
| 4,997,777 | 3/1991 | Boivin . |
| 5,134,083 | 7/1992 | Matthews .................................. 437/40 |
| 5,175,120 | 12/1992 | Lee . |
| 5,397,722 | 3/1995 | Bashir et al. ............................. 437/41 |
| 5,472,892 | 12/1995 | Gwen et al. . |
| 5,538,912 | 7/1996 | Kunori et al. . |
| 5,573,980 | 11/1996 | Yoo ........................................ 437/200 |
| 5,668,035 | 9/1997 | Fang et al. ............................... 438/239 |
| 5,668,065 | 9/1997 | Lin ........................................... 438/303 |
| 5,719,079 | 2/1998 | Yoo et al. ................................ 438/238 |
| 5,789,294 | 8/1998 | Choi ........................................ 438/258 |

*Primary Examiner*—Richard A. Booth
*Attorney, Agent, or Firm*—George O. Saile; Stephen B. Ackerman

[57] ABSTRACT

A process and structure are described wherein logic and memory share the same chip. Contacts to the memory circuits are made using the SAC process, thus ensuring maximum density, while the logic circuits are made using the SALICIDE process, thus ensuring high performance. The two processes have been integrated within a single chip by first forming polysilicon gate pedestals, those located in the memory areas also having hard masks of silicon nitride. Next, spacers are grown on the vertical sides of the pedestals. Source/drain regions are now formed using the LDD process following which the pedestals, on the memory side only, are given a protective coating of oxide (RPO). This allows the SALICIDE process to be selectively applied to only the logic side. Then, while the logic side is protected, the SAC process is applied to the memory side. This process is self-aligning. The spacers define the contact holes and the hard masks allow oversize openings to be etched without the danger of shorting through to the pedestals.

15 Claims, 8 Drawing Sheets

5,863,820

INTEGRATION OF SAC AND SALICIDE PROCESSES ON A CHIP HAVING EMBEDDED MEMORY

FIELD OF THE INVENTION

The invention relates to the general field of integrated circuits with particular reference to logic and memory areas and contacts made thereto.

BACKGROUND OF THE INVENTION

As the dimensions within integrated circuits have grown ever smaller, solutions have had to be found to problems relating to misalignment of succesive mask patterns relative to one another during processing. Thus, source and drain regions might not line up correctly relative to the gate, deposited contacts might not line up perfectly inside contact holes, and connections that were physically close together but had to be electrically isolated from one another might develop short circuits between them.

To overcome these problems, a variety of ingenious techniques have been introduced into the integrated circuit art. For example, alignment of source and drain relative to the gate was achieved by using the gate as a mask during ion implantation. The SALICIDE (self-aligned silicide) process took advantage of the fact that certain metals such as titanium or cobalt react when heated in contact with silicon to form conductive silicides but do not react with silicon oxide. Thus, oxide spacers on the vertical walls of the gate pedestal could be used to provide the necessary small, but well controlled, separation between the source and drain contacts and the gate contact.

Although the SALICIDE method made possible significant reductions in device size, as devices shrank even further shorting between the gate and the source/drain began to be a problem and an alternative approach had to be developed. This is the so-called SAC (self-aligned contact) method in which an anisotropic etch is used to form a contact hole that passes through the inter-poly oxide down to the source/drain surface. Perfect alignment of this contact hole relative to the source/drain is not needed since the spacers prevent uncovering of the vertical walls of the gate pedestal. Since etch-through of the spacers at their top (where they are very thin) cannot be avoided, the polysilicon gate pedestal is covered by a layer of silicon nitride (known as a hard mask) and the spacers formed so as to extend from the top of the hard mask to the bottom of the gate pedestal. During contact hole formation a certain amount of the hard mask material does get removed but sufficient remains so that when conductive material is deposited in the contact hole it does not short to the gate pedestal.

It has been the general practice to use the SALICIDE method for logic circuits because it made possible higher circuit performance and the SAC method for memory circuits because it allowed the cell size of the memory unit to be reduced. As long as logic and memory were on separate chips each process could be used without concern for its effect on the other. As part of the next major development in integrated circuits it has become necessary to place logic and memory circuits on the same chip. This avoids the delay introduced by off-chip drivers each time logic and memory communicate with one another. Thus, a process that allows the integration, at reasonable cost, of both the SAC and SALICIDE methods on a single chip is clearly needed. This is the subject matter of the present invention.

While there are many references in the prior art to both processes, none of these, to our knowledge, addresses the specific problem of integrating these different contacting methods for use on a single chip in both memory and logic circuits. Among the references that we found to be of interest we include Fang et al. (U.S. Pat. No. 5,668,035 September 1997) who teach formation of a memory chip with embedded logic but the problem of making optimum (and therefore different) contacts to the two areas is not addressed. Bashir et al. (U.S. Pat. No. 5,397,722 March 1995) teach a method for self-alignment in which silicon nitride spacers are formed on the contacting poly layer. The remaining poly is then oxidized following which the silicon nitride is removed and the now unprotected underlying poly is etched away. Yoo (U.S. Pat. No. 5,573,980 November 1996) shows how contact resistance may be reduced by depositing a thin layer of polysilicon prior to silicidation.

Lin (U.S. Pat. No. 5,668,065 September 1997) describe a process for simultaneously forming a self aligned contact, a local interconnect, and a self-aligned silicide in a semiconductor device. No distinction is drawn between logic and memory areas, so that selective removal of the hard mask (a key feature of the present invention) does not take place. Matthews (U.S. Pat. No. 5,134,083 July 1992) teaches the use of self-aligned interconnects in BICMOS circuits.

SUMMARY OF THE INVENTION

It has been an object of the present invention to provide a method and structure in which two different contacting methods, namely SALICIDE and SAC, have been selectively applied to logic and memory areas, respectively, said areas being located on the same chip.

A further object of the present invention has been that said method be fully compatible with existing methods currently used to implement the SALICIDE and SAC processes separately.

These objects have been achieved by first forming polysilicon gate pedestals, those located in the memory areas also having hard masks of silicon nitride. Spacers are then grown on the vertical sides of the pedestals. Source/drain regions are now formed using the LDD process following which the pedestals, on the memory side only, are given a protective deposition of oxide (RPO). This allows the SALICIDE process to be selectively applied to only the logic side. Then, while the logic side is protected by the subsequent deposition of the inter-poly oxide, the SAC process is applied to the memory side. This process is self-aligning. The long spacers define the contact holes and the hard masks allow oversize openings to be etched without the danger of shorting through to the pedestals.

DESCRIPTION OF THE PREFERRED EMBODIMENTS

The process that we describe below is suitable for an integrated circuit that has both logic and memory areas. In the logic areas contact to source/drain is made using the SALICIDE method while in the memory area contact is made by the SAC method.

The process, as claimed, starts with a P type silicon wafer since the intent is to end up with N-channel devices, but it will be understood by those skilled in the art that P-channel devices could equally well have been made using this general approach. The first step is to deposit on the wafer successive layers of gate oxide, polysilicon, silicon oxide (to serve as both a stress reducer and an etch stop layer), and silicon nitride. The gate oxide 11 is between about 30 and 150 Angstroms thick, the polysilicon layer between about 1,000 and 2,000 Angstroms thick, the silicon oxide between about 100 and 1,000 Angstroms thick, and the silicon nitride layer between about 1,000 and 2,000 Angstroms thick. The latter is patterned and etched to form a mask (known as a hard mask) that will be used to define the gate pedestal when the two underlying layers get etched.

Figure 1:
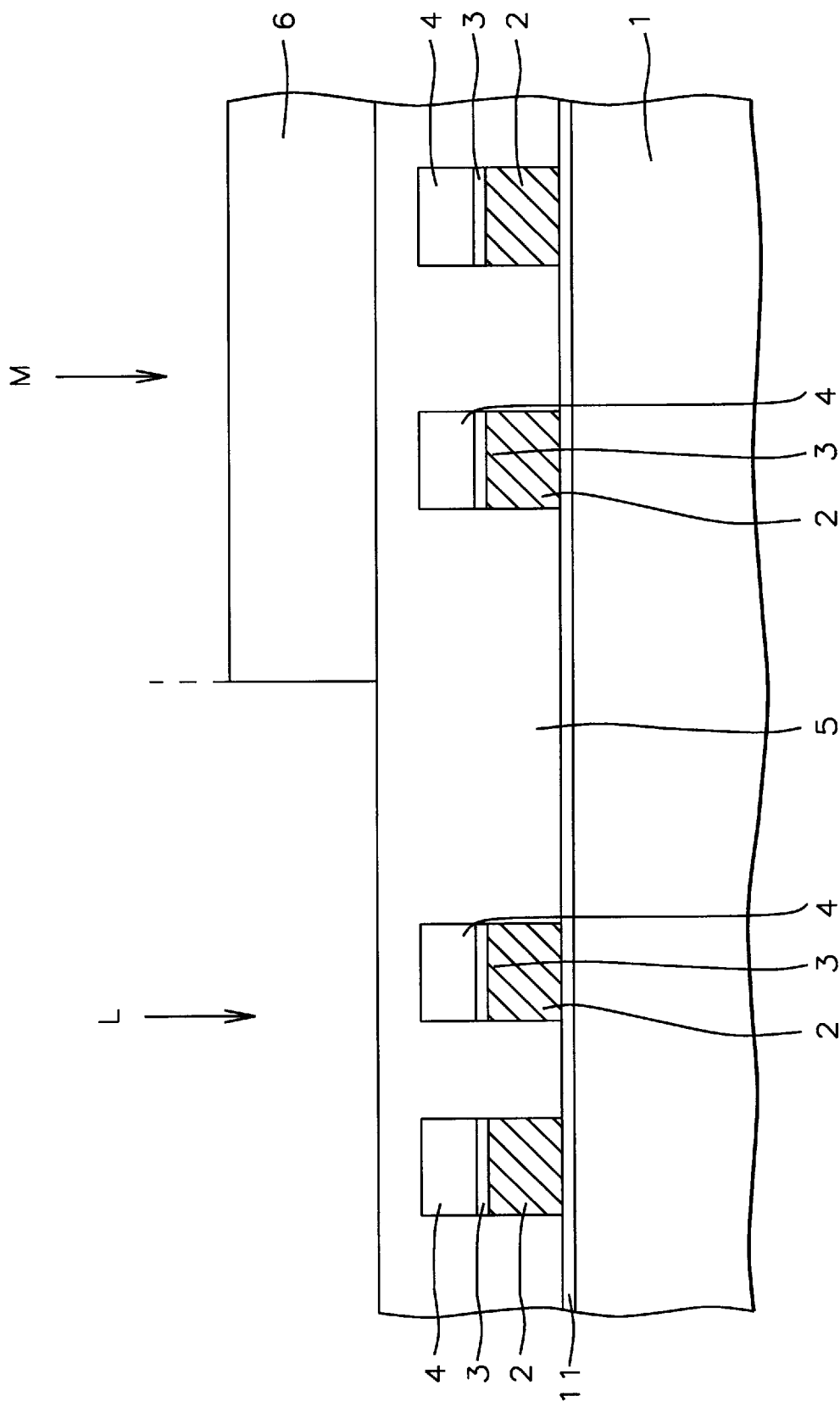
FIG. 1 shows how a silicon wafer, divided into logic and memory areas, is first provided with gate pedestals that include silicon nitride hard masks. Both sides are covered by BPR but the memory side is further protected by a photoresist mask.

This can be seen by referring to FIG. 1 in which polysilicon gate pedestals 2 have been formed on the surface of silicon wafer 1. Silicon oxide layer 3 is present on the top of pedestal 2, between it and hard mask 4, to reduce stress and to act as an etch stop (as discussed above).

Next, layer 5 of Bottom Photo-Resist (BPR) is laid down by spin coating to a thickness between about 1,000 and 2,000 Angstroms, which is sufficient to fully cover hard mask 3. The material we have preferred to use for our BPR has been a primary polyimide dye dissolved in cyclohexanone or PGMEA or a primary polyimide, having no dye component, dissolved in cyclohexanone or PGMEA but other BPR compositions could also have been used. BPR layer 3 is then coated with photoresist that is patterned so that it covers only the memory area. The appearance of the structure at this stage of the process is as shown in FIG. 1.

Figure 2:
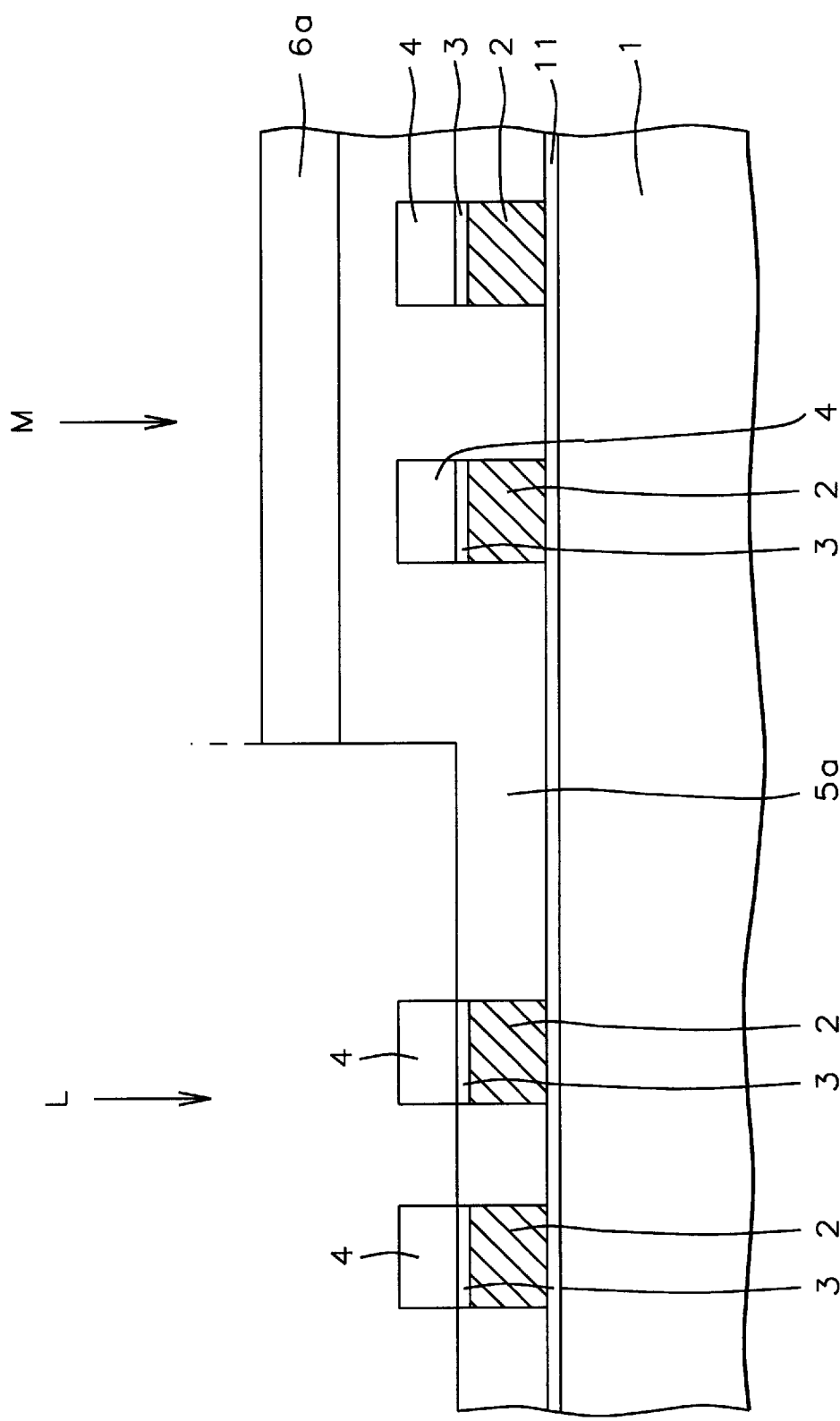
FIGS. 2 and 3 illustrate how, after the hard masks are removed on the logic side, spacers are grown and source/drain regions are formed on both sides.

The BPR layer is now etched using a $O_2/N_2$ ion plasma while silicon oxide layer 3 continues to be covered by the BPR. Since the etchant also attacks photoresist, the thickness of the photoresist layer covering the memory area is also reduced, giving the structure the appearance shown in FIG. 2, where the photoresist is now designated as 6a and the modified BPR layer as 5a.

Figure 3:
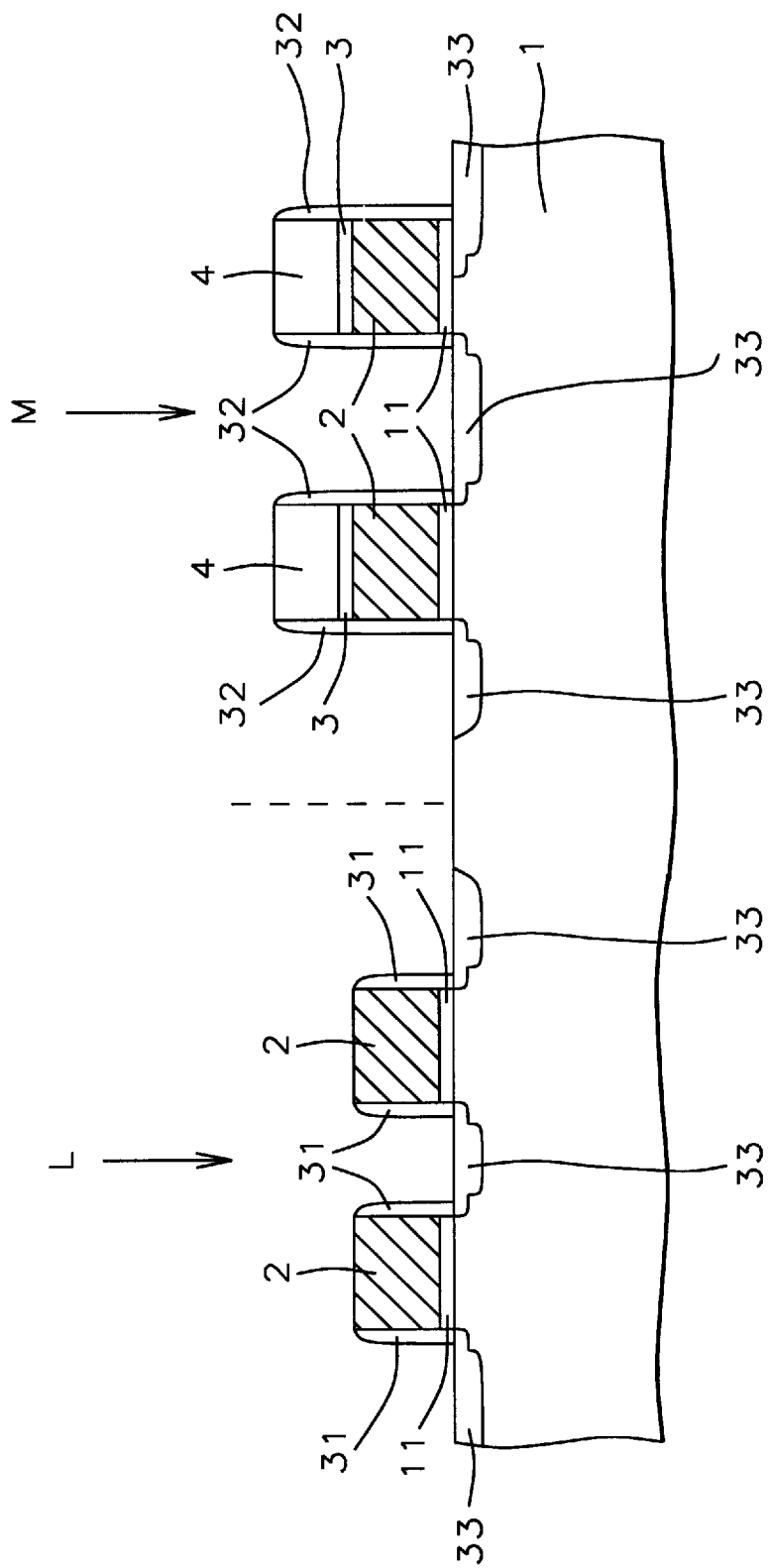

Referring now to FIG. 3, silicon nitride hard mask 4 is removed in the logic area only. Removal of layer 3 at this stage is optional as it could also be removed later during RPO etching. Next, BPR layer 5a and photoresist layer 6a are also removed. Then, source/drain regions 33 are formed using the standard Low Density Drain (LDD) process which includes, inter alia, growing silicon oxide spacers on the vertical walls of the pedestals in both the logic and the memory areas. As seen, pedestals 31 in the logic area are of the standard type, extending from the surface of wafer 1 to the top of the polysilcon gate pedestal. Spacers 32 (in the memory area), on the other hand, extend from the wafer surface to the top of the hard mask.

Figure 4:
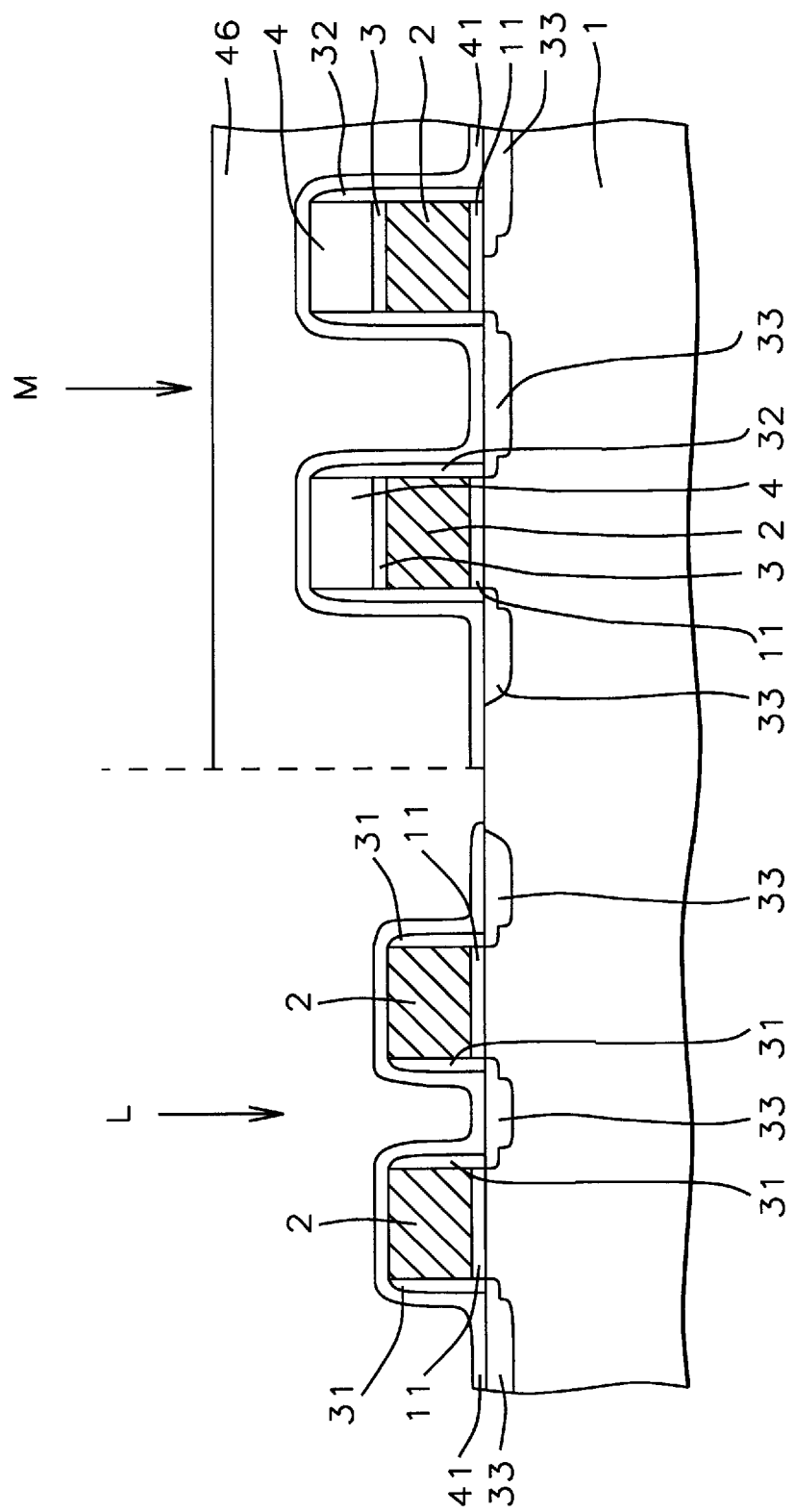
FIGS. 4 and 5 illustrate how the SALICIDE process is selectively applied to only the logic side.

As seen in FIG. 4, the next step is to deposit layer 41 of resist protecting oxide (RPO) on the wafer to a thickness between about 100 and 400 Angstroms. The RPO 41 is then selectively covered in the memory area by photoresist layer 46.

The RPO in the logic area is now removed leaving RPO 41 in place only in the memory area and the standard SALICIDE process is applied to the wafer. First, a layer of a silicide forming metal such as titanium or cobalt or titanium/titanium nitride is deposited over the entire wafer to a thickness between about 200 and 500 Angstroms. Our preferred method for depositing the metal has been sputtering (RF OR DC) but similar methods, such as CVD, could also have been used.

Figure 5:
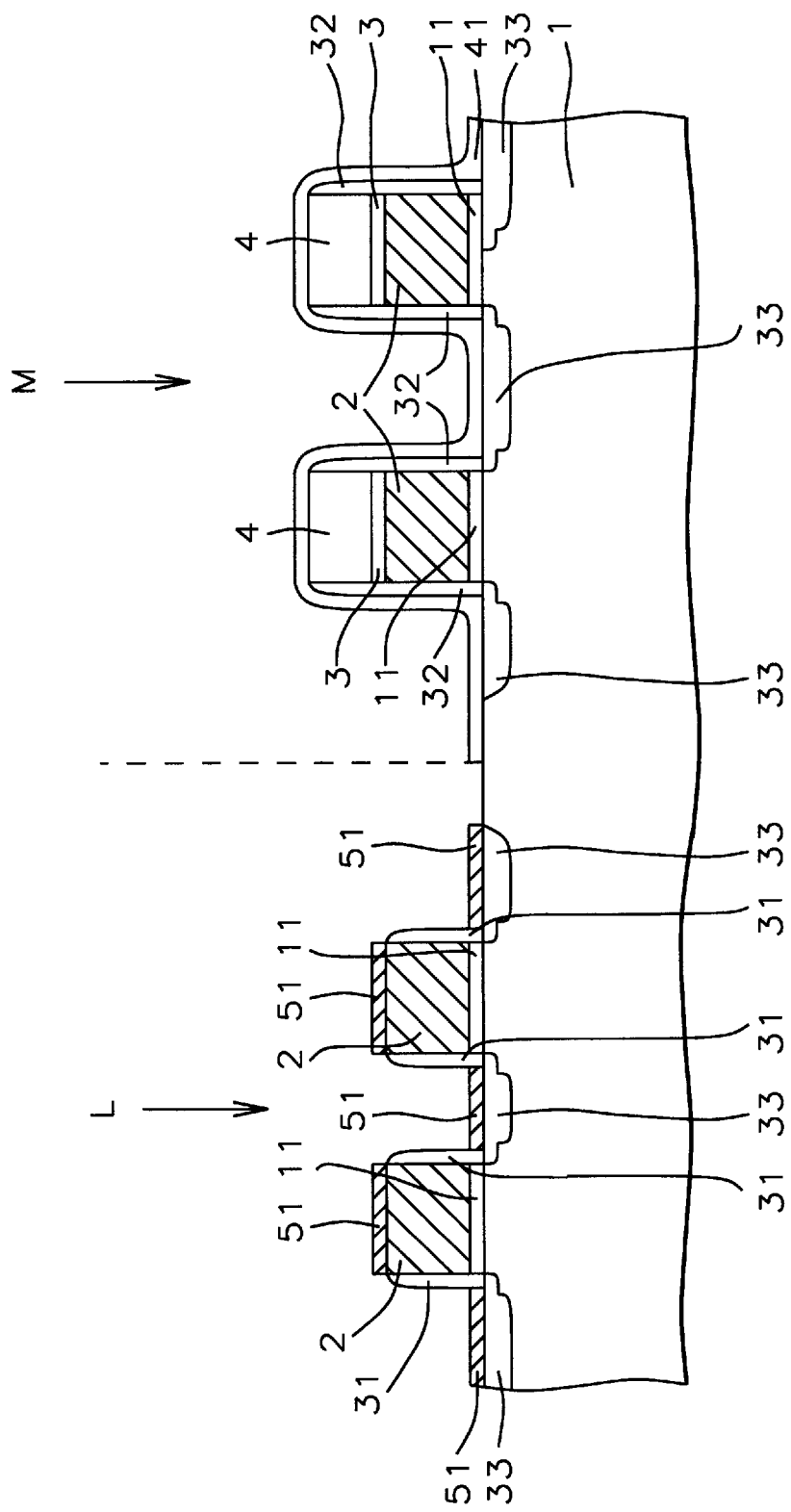

The wafer is then given a rapid thermal anneal (RTA), typically between about 10 and 30 seconds at between about 650° and 750° C. This has the effect of causing the deposited metal to be converted to its silicide wherever it is in direct contact with silicon. A selective etchant, such as ammonium hydroxide and hydrogen peroxide in water, is then used to remove all unreacted metal, i.e. all metal that was in contact with silicon oxide rather than silicon, giving the structure shown in FIG. 5 where the silicide regions have been designated as 51. Note that in this manner the SALICIDE process has been limited to the logic area.

Figure 6:
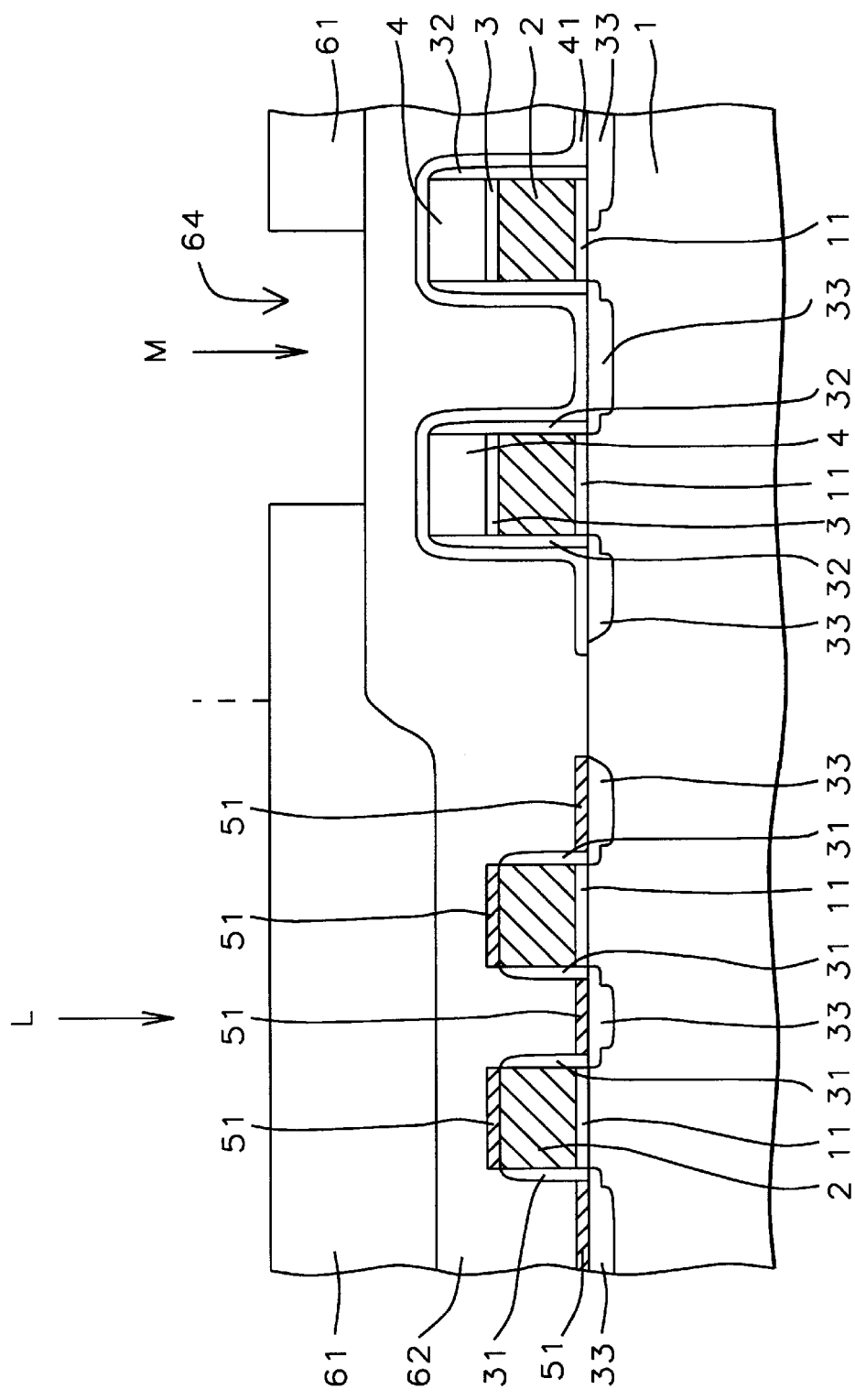
FIGS. 6, 7, and 8 illustrate how the SAC process is selectively applied to only the memory side.

Referring now to FIG. 6, following a second RTA at between about 800° and 900° C. for between about 10 and 30 seconds, for the purpose of causing the titanium silicide to change its crystal structure to a lower resistivity phase, a layer of inter poly oxide (IPO) 62 is deposited over the wafer to a thickness between about 2,000 and 4,000 angstroms, which is sufficient to fully cover both the logic and the memory areas. This is followed by photo-resist mask 61 which is patterned to provide openings 64 which are located directly above wherever it is intended that contact to source/drain areas in the memory area will be made.

Figure 7:
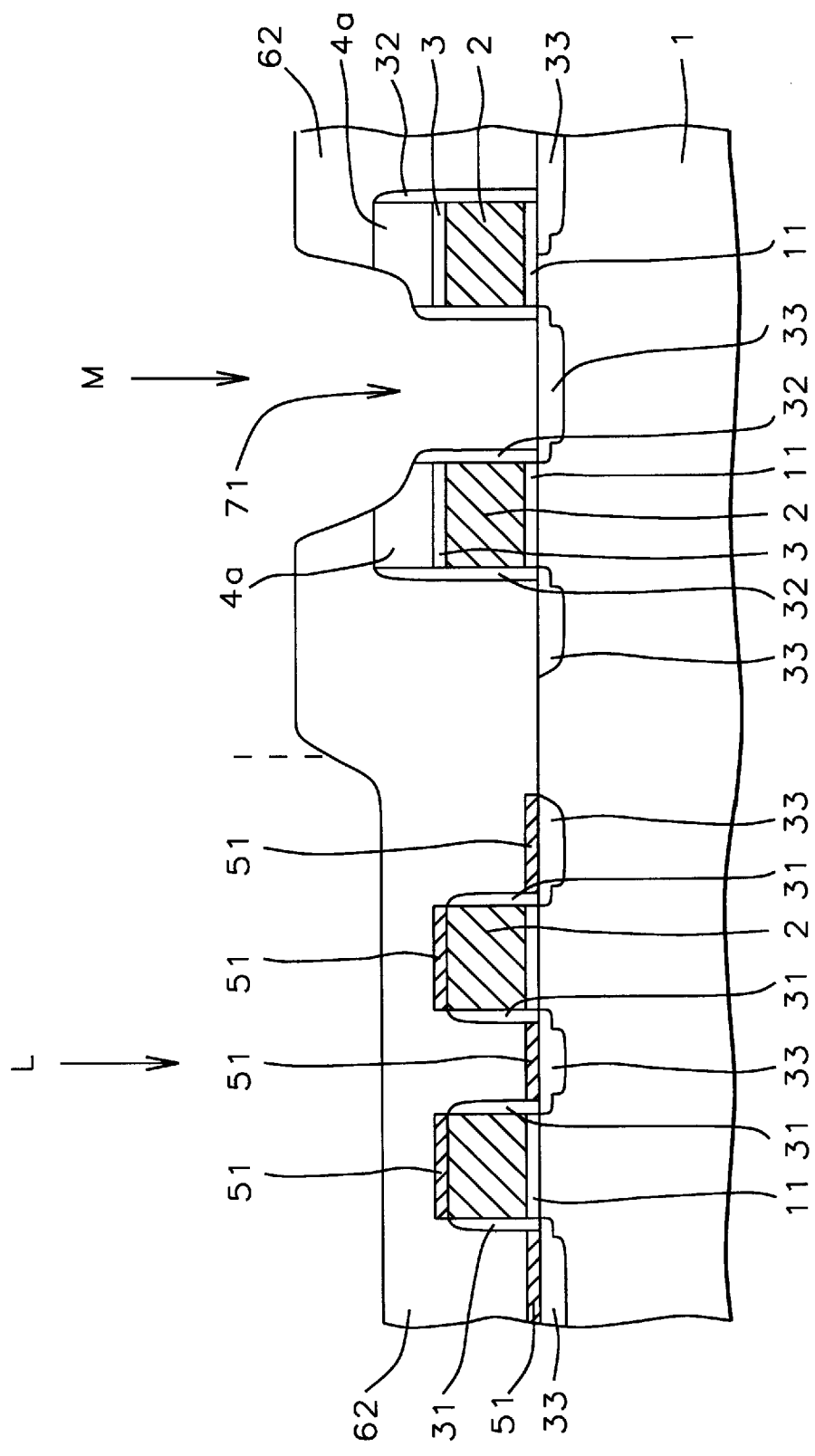
Figure 8:
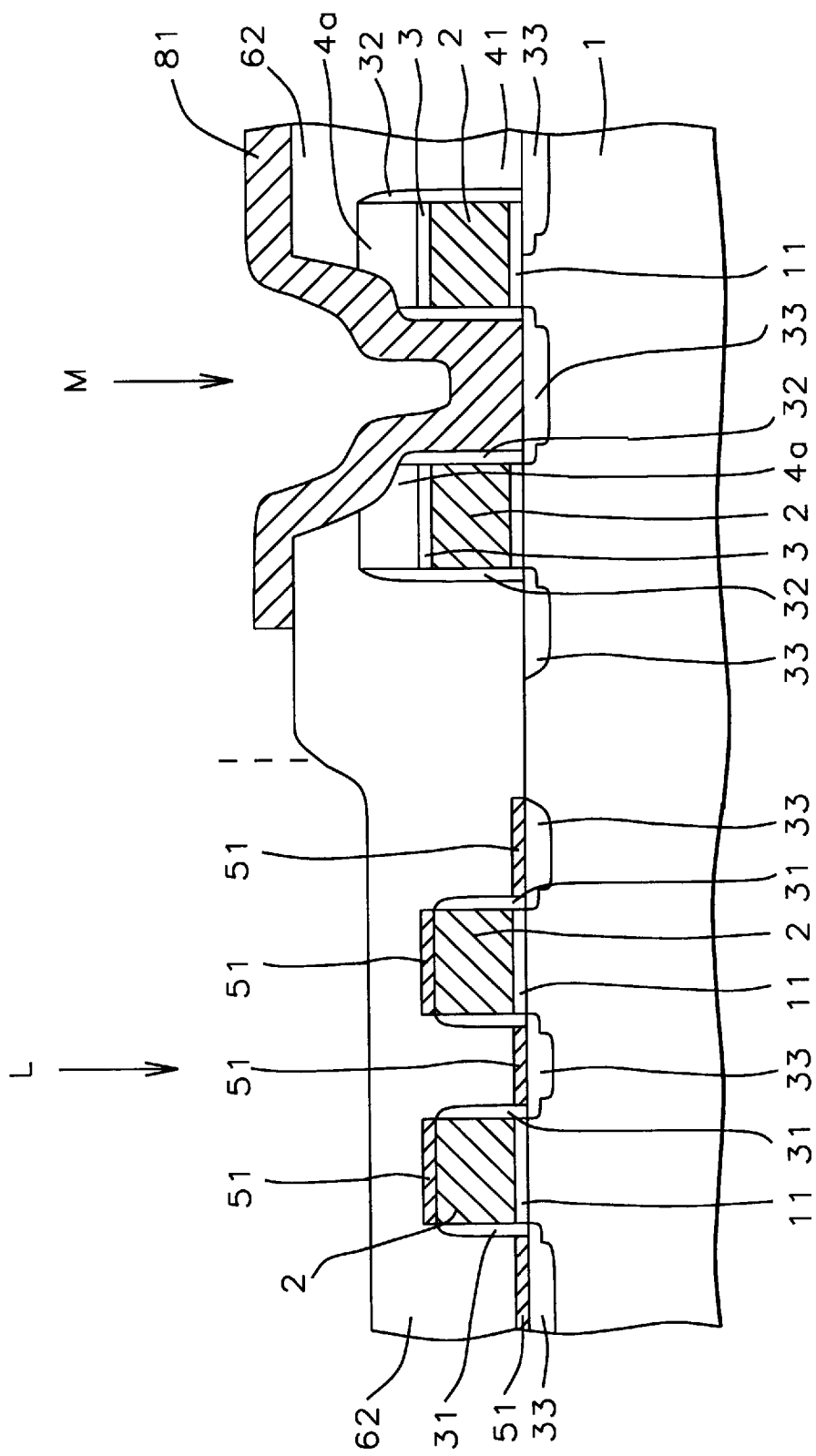

FIG. 7 illustrates the effect of etching contact holes 71 in the memory area (the logic area being protected by photoresist layer 62). Etching of IPO layer 62 was effected using a fluorine based etchant at a temperature between about 40° and 60° C. for between about 0.3 and 1 minutes. As can be seen, precise alignment of opening 64 was not needed because spacers 32 define the exact shape and position of the contact hole (hence the term self-aligned contact or SAC). Even if some portion of hard mask 4 is etched away as a side effect of the hole opening process, the partially eroded hard mask (designated as 4a in FIG. 7) still covers gate pedestal 2 so shorting between the latter and contacting layer 81 (see FIG. 8) will not occur. Our preferred material for layer 81 has been polysilicon but other conductive materials including polycides such as poly/tungsten silicide or metals such as titanium, titanium nitride, or aluminum copper could also have been used. The thickness of layer 81 is between about 500 and 5,000 Angstroms.

While the invention has been particularly shown and described with reference to the preferred embodiments thereof, it will be understood by those skilled in the art that various changes in form and details may be made without departing from the spirit and scope of the invention.

What is claimed is:

1. A method of forming contacts in an integrated circuit that contains logic and memory areas, comprising the sequential steps of:

providing a P type silicon wafer;

depositing on the wafer successive layers of gate oxide, first polysilicon, first silicon oxide, and silicon nitride;

patterning and etching the silicon nitride to form a hard mask;

forming gate pedestals having vertical sides by removing the silicon oxide and first polysilicon layers wherever they are not protected by said hard mask;

coating the wafer with a BPR layer to a thickness sufficient to lower the gates, including the layer of silicon nitride;

coating the BPR layer with photoresist that is patterned to cover only the memory area;

etching the BPR layer, thereby uncovering the silicon nitride layer in the logic area;

removing the uncovered silicon nitride, the photoresist and the BPR layers;

forming N type source and drain regions adjacent to said vertical sides by means of ion implantation into said adjacent regions together with the formation of spacers on said vertical sides;

depositing a layer of resist protecting oxide on the wafer;

selectively removing the resist protecting oxide from the logic area;

depositing a layer of a silicide forming metal on the wafer;

subjecting the wafer to a first rapid thermal anneal whereby the metal reacts to form a layer of silicide wherever it is in direct contact with silicon;

removing all unreacted metal thereby forming self-aligned source, gate, and drain contacts in the logic area;

subjecting the wafer to a second rapid thermal anneal;

depositing a layer of inter poly oxide over the wafer sufficient to fully cover both the logic and the memory area;

patterning and etching the inter poly oxide to form contact holes in the memory area;

depositing a second polysilicon layer; and patterning and etching the second polysilicon layer to form connections to said contact holes.

2. The method of claim 1 wherein said first layer of polysilicon is deposited to a thickness between about 1,000 and 3,000 Angstroms.

3. The method of claim 1 wherein said first layer of silicon oxide is deposited to a thickness between about 100 and 1,000 Angstroms.

4. The method of claim 1 wherein said layer of silicon nitride is deposited to a thickness between about 1,000 and 2,000 Angstroms.

5. The method of claim 1 wherein the BPR layer is a primary polyimide dye dissolved in cyclobexanone or PGMEA or a primary polyimide, having no dye component, dissolved in cyclobexanone or PGMEA.

6. The method of claim 1 wherein the BPR layer is laid down to a thickness between about 1,000 and 2,000 Angstroms.

7. The method of claim 1 wherein said layer of resist protecting oxide is deposited to a thickness between about 100 and 400 Angstroms.

8. The method of claim 1 wherein said layer of silicide forming metal is deposited to a thickness between about 200 and 500 Angstroms.

9. The method of claim 1 wherein said layer of silicide forming metal is titanium or cobalt or titanium/titanium nitride.

10. The method of claim 1 wherein said first rapid thermal anneal further comprises heating the wafer to a temperature between about 650° and 750° C. for between about 10 and 30 seconds.

11. The method of claim 1 wherein said second rapid thermal anneal further comprises heating the wafer to a temperature between about 800° and 900° C. for between about 10 and 30 seconds.

12. The method of claim 1 wherein said layer of inter poly oxide is deposited to a thickness between about 2,000 and 4,000 Angstroms.

13. The method of claim 1 wherein the step of patterning and etching the inter poly oxide to form contact holes in the memory area further comprises etching in a fluorine based etch at a temperature between about 40° and 60° C. for between about 0.3 and 1 minutes.

14. The method of claim 1 wherein the second layer of polysilicon is deposited to a thickness between about 500 and 5,000 Angstroms.

15. The method of claim 1 wherein the step of etching the BPR layer further comprises using a $O_2/N_2$ ion plasma.

* * * * *

UNITED STATES PATENT AND TRADEMARK OFFICE
CERTIFICATE OF CORRECTION

PATENT NO. : 5,863,820
DATED : 01/26/99
INVENTOR(S) : Jenn Ming Huang

It is certified that error appears in the above-identified patent and that said Letters Patent is hereby corrected as shown below:

On the Cover Page, at (75), delete "Taiwan, Taiwan", and replace with --Hsin-Chu, Taiwan--.

Signed and Sealed this

Seventh Day of September, 1999

Attest:

Q. TODD DICKINSON

*Attesting Officer*  *Acting Commissioner of Patents and Trademarks*